(12) United States Patent
Yen

(10) Patent No.: US 8,362,497 B2
(45) Date of Patent: Jan. 29, 2013

(54) LED LAMP WITH IMPROVED DIE ARRANGEMENT

(76) Inventor: Hsu Li Yen, Taipei County (TW)

(*) Notice: Subject to any disclaimer, the term of this patent is extended or adjusted under 35 U.S.C. 154(b) by 121 days.

(21) Appl. No.: 12/951,393

(22) Filed: Nov. 22, 2010

(65) Prior Publication Data

US 2012/0126254 A1    May 24, 2012

(51) Int. Cl.
*H01L 33/00* (2010.01)
(52) U.S. Cl. ................... 257/88; 257/89; 362/92
(58) Field of Classification Search .......... 257/88, 257/89; 362/92, 235
See application file for complete search history.

(56) References Cited

U.S. PATENT DOCUMENTS

| | | | | |
|---|---|---|---|---|
| 2008/0100790 A1* | 5/2008 | Kang et al. | | 349/161 |
| 2010/0177400 A1* | 7/2010 | Yamamura | | 359/619 |
| 2010/0231573 A1* | 9/2010 | Adachi | | 345/211 |
| 2011/0050654 A1* | 3/2011 | Tsutsui et al. | | 345/204 |

* cited by examiner

*Primary Examiner* — Phuc Dang
(74) *Attorney, Agent, or Firm* — Rosenberg, Klein & Lee

(57) ABSTRACT

An LED lamp with improved die arrangement includes a main board equipped with a plurality of lines of light-emitting dies. The lines of the light-emitting dies are spaced by a distance equal to or greater than 0.38 mm. A number of the light-emitting dies in each of the lines may be added or reduced for fitting the main board. The light-emitting dies in one of the lines may be aligned with or offset from the light-emitting dies in the adjacent line. The LED lamp may have the light-emitting dies deployed in both of the aligned manner and the offset manner, so that the light-emitting dies fit a desired lighting pattern of the LED lamp and the LED lamp illuminates with enhanced uniformity and brightness.

2 Claims, 8 Drawing Sheets

LED LAMP WITH IMPROVED DIE ARRANGEMENT

BACKGROUND OF THE INVENTION

1. Technical Field

The present invention relates to LED lamps, and more particularly, to an LED lamp with improved die arrangement.

2. Description of Related Art

In modern life space, various lamps for providing illumination may be installed at desired locations to cast light and change the brightness in the space. Therefore, lighting equipment is important to human life for not only improving life quality but also supporting human health as well as eyesight.

The basic requirement for lighting devices is sufficient illumination that lights up space and allow people with good visibility. Therein, whether light emitted by a lighting device is stable is highly related to visual health. In addition, in the process of making lighting devices, the environment-related concerns raised by materials and recycling, as well as power consumption of lighting devices, are issues attracting more and more attention.

Recently, many news reports state that traditional lamps are harmful to human body and the environment, and it is the worldwide trend that LED lamps have gradually replaced traditional lamps. This is because LED lamps are free from environment-related concerns and are harmless to human body, while providing better brightness and stability and consuming less power as compared with traditional lamps. Thus, LED lamps are an ideal light source for today and the future.

However, dies in an existing LED lamp are typically arranged into a square array. Such a square array is not suitable for lamps of shapes other than a square shape and is not perfect for providing optimal illumination.

In view of the shortcomings of the existing LED lamps, the inventor of the present invention, after numerous researches and tests, eventually invented a refined design.

SUMMARY OF THE INVENTION

An LED lamp with improved die arrangement includes a main board equipped with a plurality of lines of light-emitting dies. The lines of the light-emitting dies are spaced by a distance equal to or greater than 0.38 mm. A number of the light-emitting dies in each of the lines may be added or reduced for fitting the main board. The light-emitting dies in one of the lines may be aligned with or offset from the light-emitting dies in the adjacent line. The LED lamp may have the light-emitting dies deployed in both of the aligned manner and the offset manner, so that the light-emitting dies fit a desired lighting pattern of the LED lamp and the LED lamp illuminates with enhanced uniformity and brightness.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
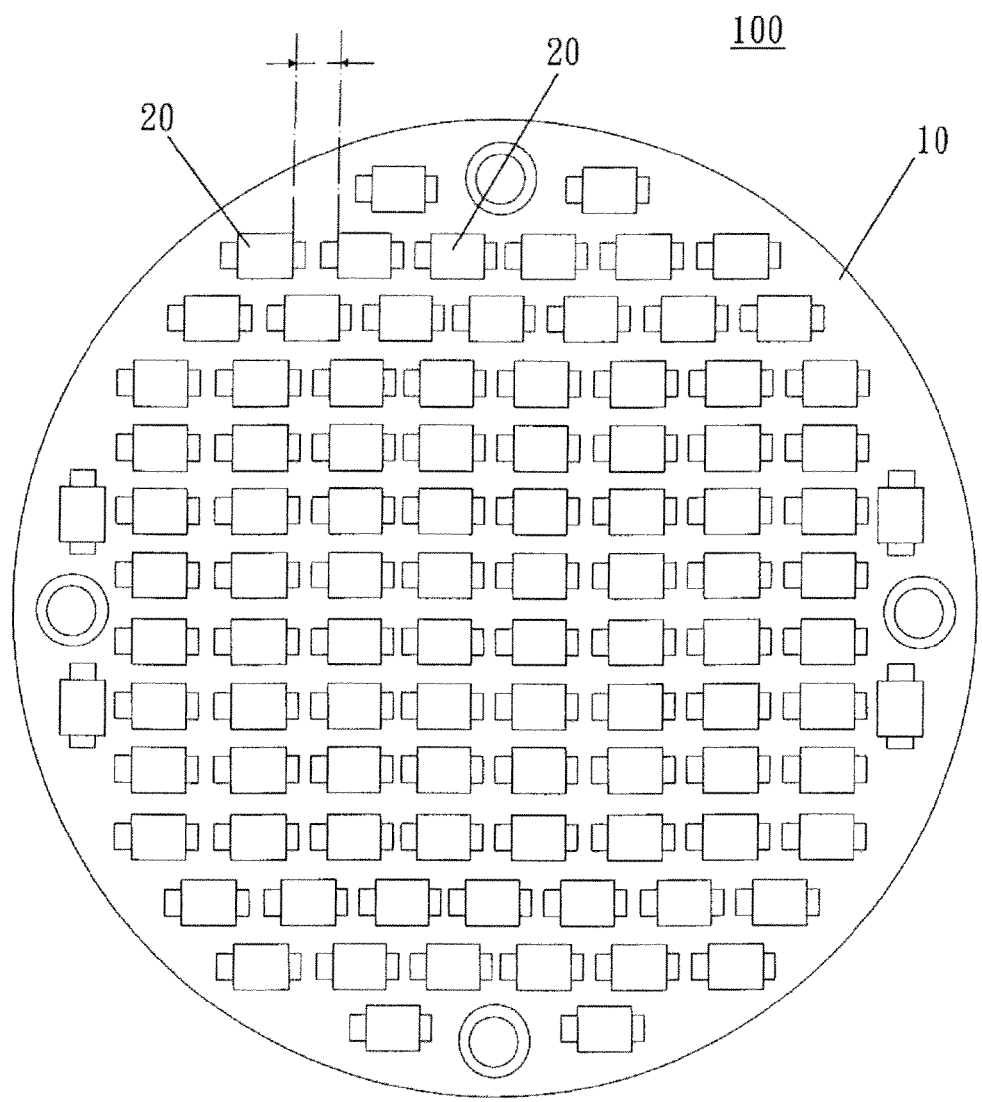
FIG. 1 is one embodiment of an LED lamp with improved die arrangement according to the present invention, wherein 98 dies are arranged.
Figure 2:
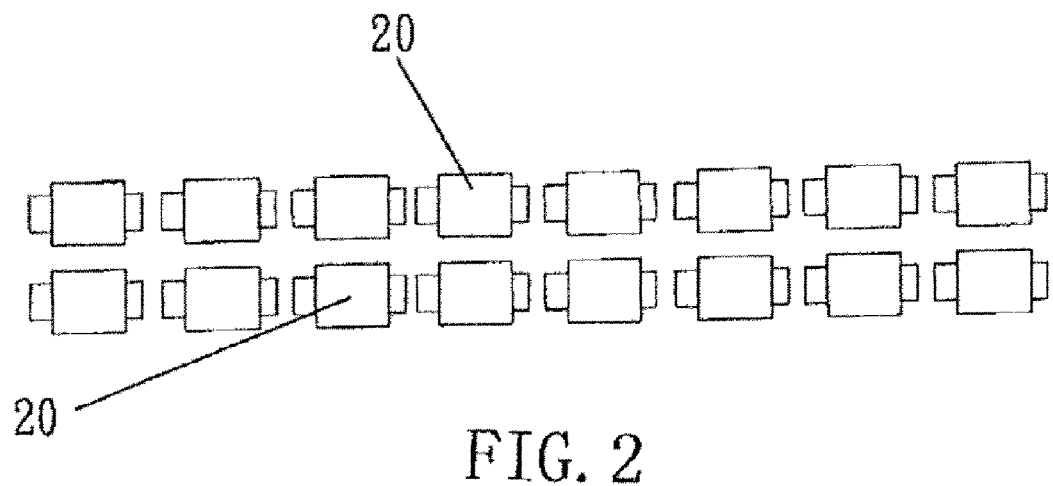
FIG. 2 is an enlarged view of the light-emitting dies wherein the dies in adjacent lines are aligned with each other.
Figure 3:
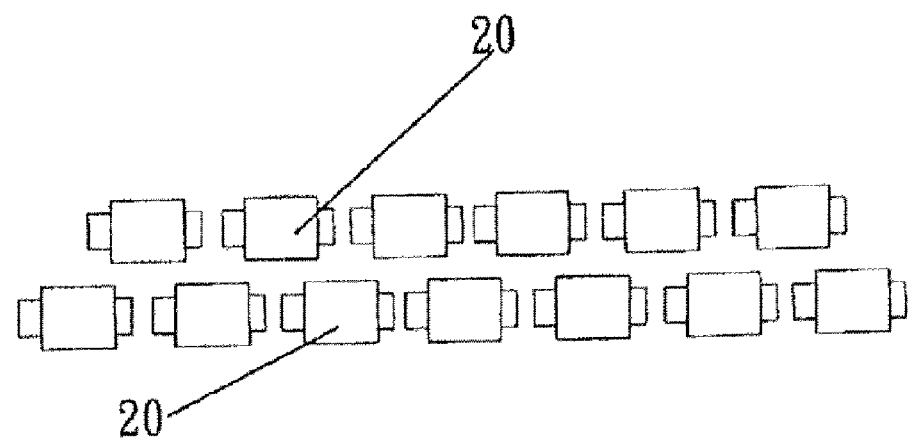
FIG. 3 is another enlarged view of the light-emitting dies wherein the dies in adjacent lines are offset from each other.

FIG. 1 is one embodiment of an LED lamp with improved die arrangement according to the present invention, wherein 98 dies are arranged. As shown therein, and also in FIGS. 4, 5, 6, 7 and 8, a main board 10 is equipped with a plurality of lines of light-emitting dies 20 so as to form the LED lamp 100. Therein, the lines of light-emitting dies 20 are spaced by a distance equal to or greater than 0.38 mm. The light-emitting dies 20 in the adjacent lines are aligned with each other (as shown in FIG. 2) or offset from each other (as shown in FIG. 3) when arranged one the main board 10. Alternatively, as reflected in FIG. 1, the main board 20 may have some of the light-emitting dies 20 deployed in the aligned manner and the rest of the light-emitting dies 20 deployed in the offset manner.

Figure 4:
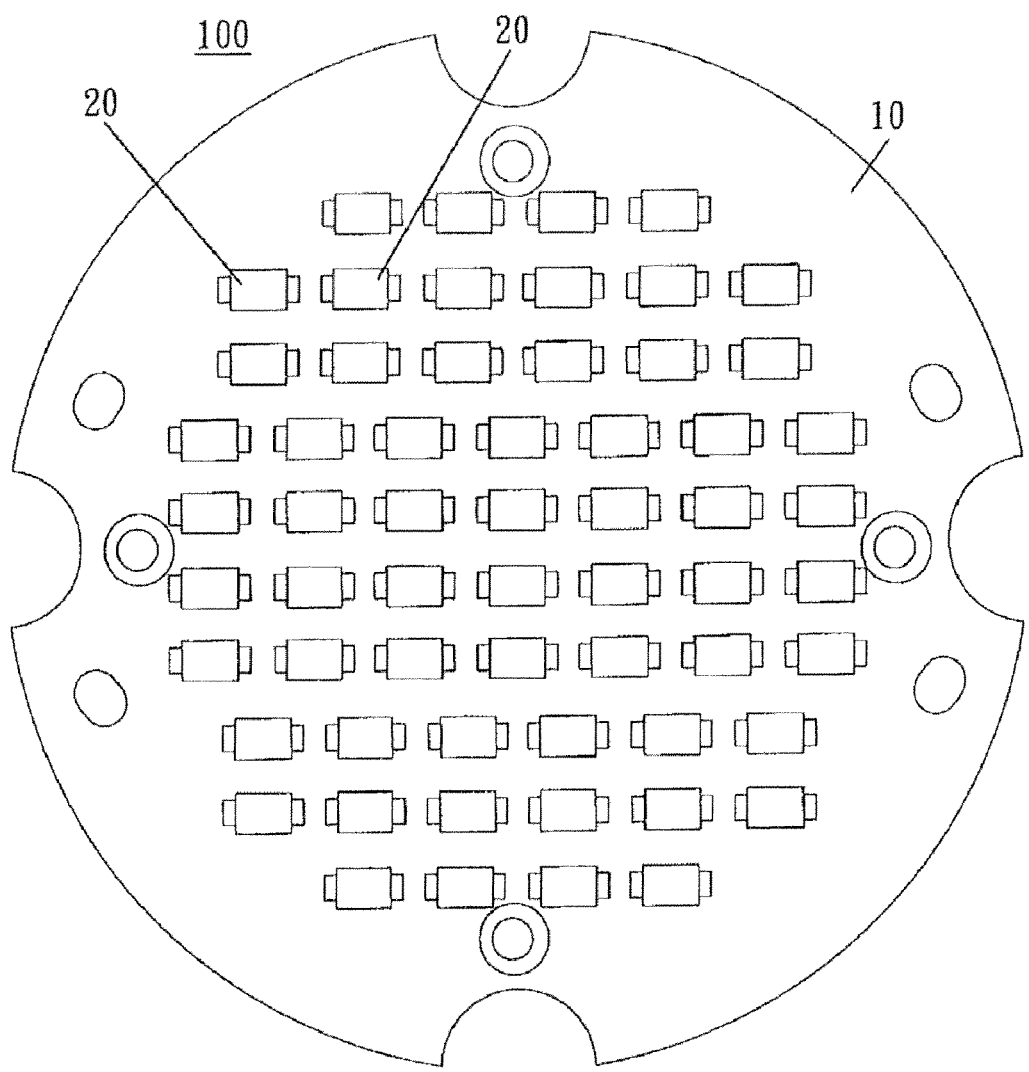
FIG. 4 is another embodiment of the LED lamp of the present invention, wherein 60 dies are arranged.

FIG. 4 is another embodiment of the LED lamp of the present invention, wherein 60 dies are arranged.

Figure 5:
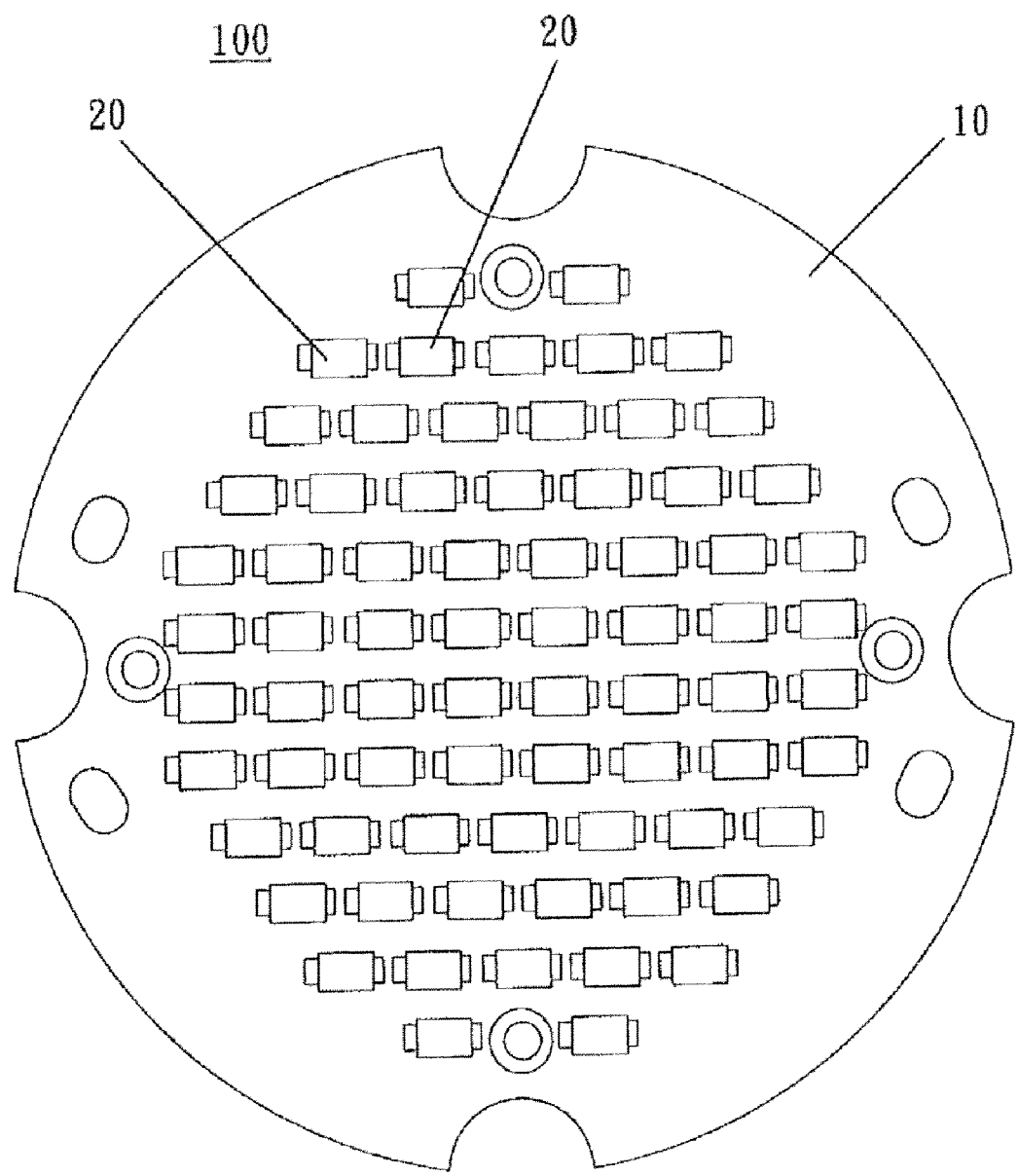
FIG. 5 is another embodiment of the LED lamp of the present invention, wherein 72 dies are arranged.

FIG. 5 is another embodiment of the LED lamp of the present invention, wherein 72 dies are arranged.

Figure 6:
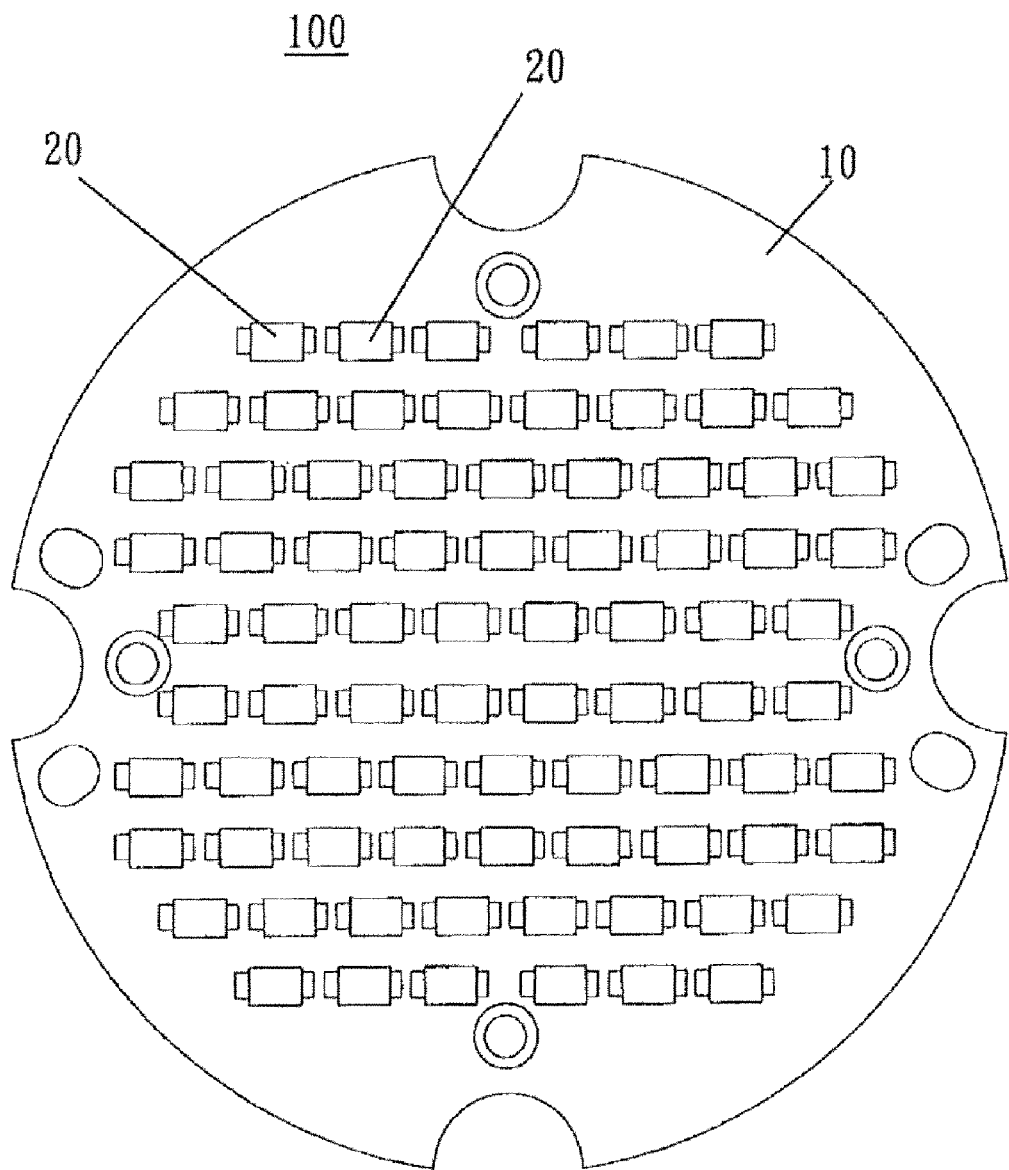
FIG. 6 is another embodiment of the LED lamp of the present invention, wherein 80 dies are arranged.

FIG. 6 is another embodiment of the LED lamp of the present invention, wherein 80 dies are arranged.

Figure 7:
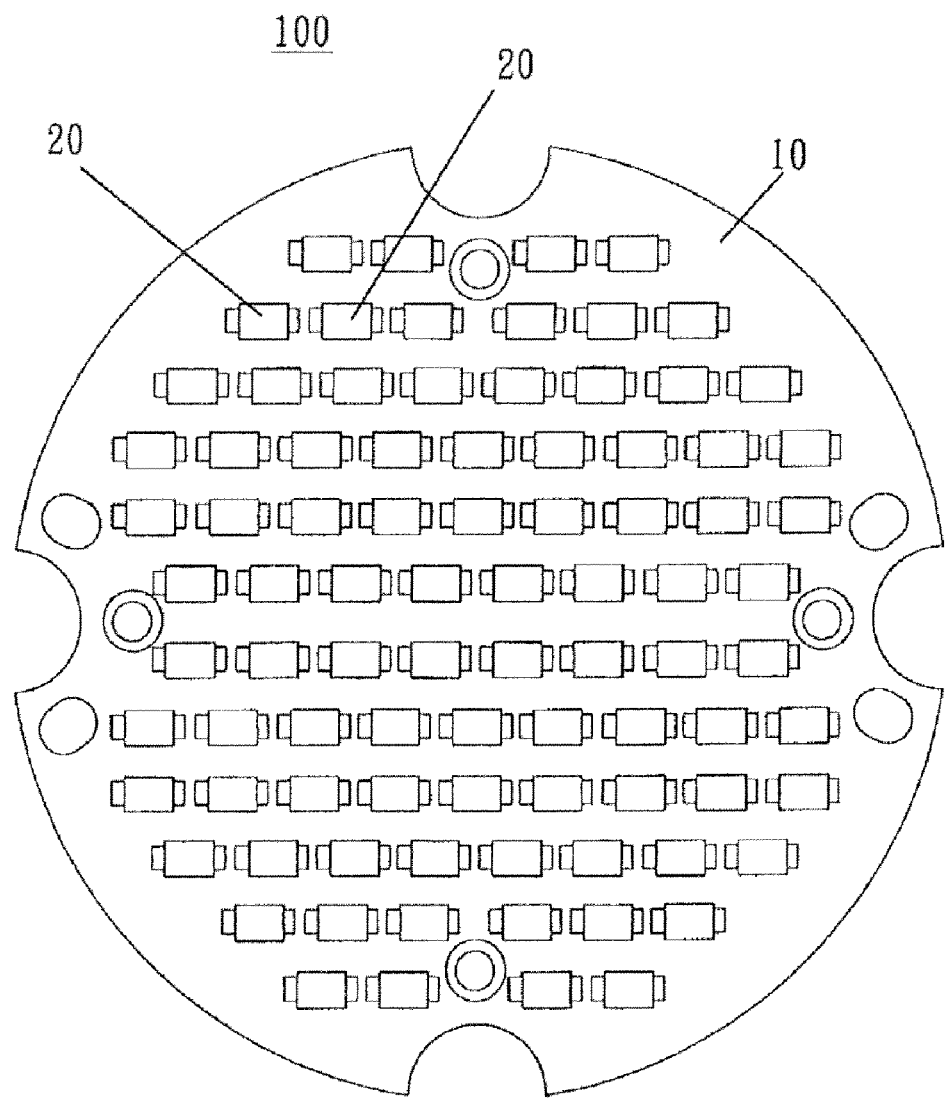
FIG. 7 is another embodiment of the LED lamp of the present invention, wherein 88 dies are arranged.

FIG. 7 is another embodiment of the LED lamp of the present invention, wherein 88 dies are arranged.

Figure 8:
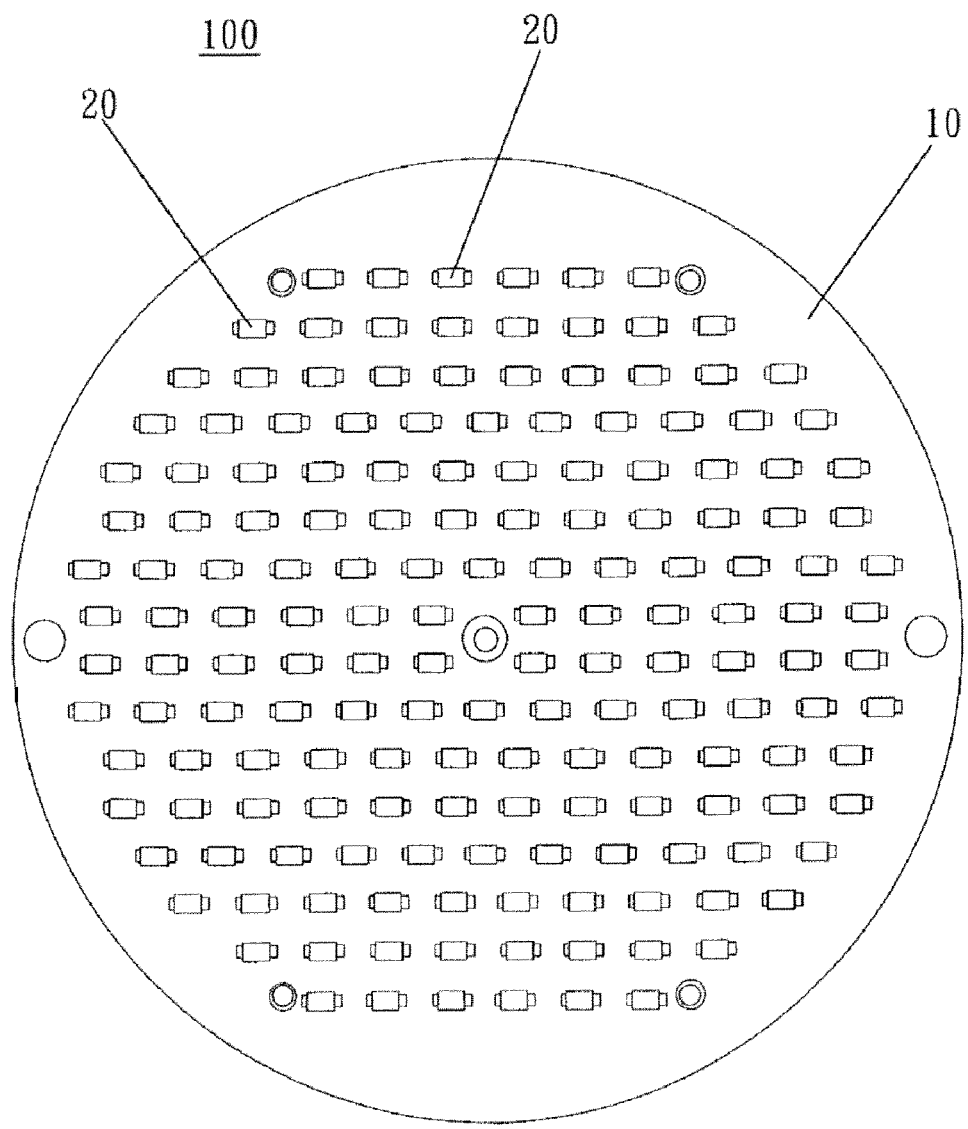
FIG. 8 is another embodiment of the LED lamp of the present invention, wherein 168 dies are arranged.

FIG. 8 is another embodiment of the LED lamp of the present invention, wherein 168 dies are arranged.

Figure 9:
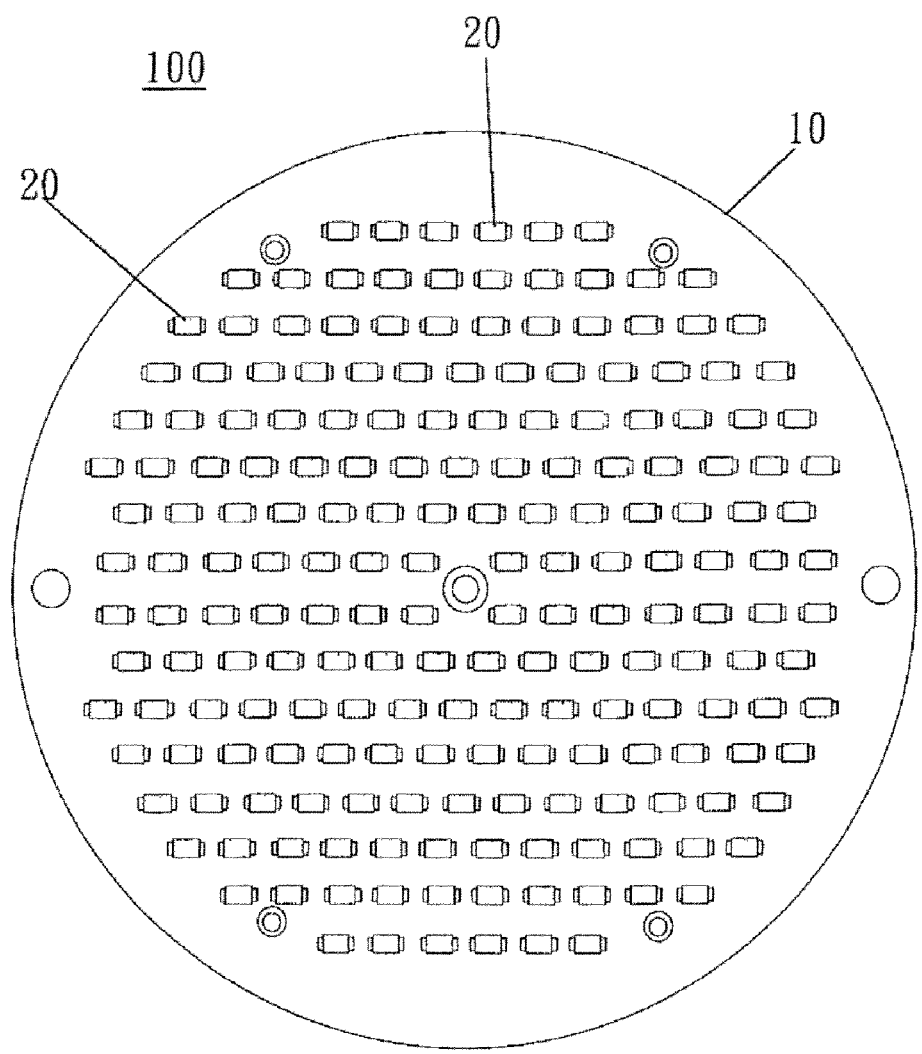
FIG. 9 is another embodiment of the LED lamp of the present invention, wherein 196 dies are arranged.

FIG. 9 is another embodiment of the LED lamp of the present invention, wherein 196 dies are arranged.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. An LED lamp with improved die arrangement, comprising a main board equipped with a plurality of lines of light-emitting dies, wherein the lines of the light-emitting dies are spaced by a distance equal to or greater than 0.38 mm; and the light-emitting dies are such arranged on the main board that the light-emitting dies in adjacent said lines are offset from each other.

2. An LED lamp with improved die arrangement, comprising a main board equipped with a plurality of lines of light-emitting dies, wherein the lines of the light-emitting dies are spaced by a distance equal to or greater than 0.38 mm; and the light-emitting dies are such arranged on the main board that some of the light-emitting dies are aligned with other said light-emitting dies in adjacent said lines while the rest of the light-emitting dies are offset from other said light-emitting dies in adjacent said lines.

* * * * *